United States Patent [19]

Nakamura

[11] Patent Number: 5,089,055
[45] Date of Patent: Feb. 18, 1992

[54] SURVIVABLE SOLAR POWER-GENERATING SYSTEMS FOR USE WITH SPACECRAFT

[76] Inventor: Takashi Nakamura, 5964 Harbord Dr., Oakland, Calif. 94611

[21] Appl. No.: 448,943

[22] Filed: Dec. 12, 1989

[51] Int. Cl.$^5$ .................. H01L 31/052; H01L 31/058
[52] U.S. Cl. .................................... 136/248; 136/246; 136/292; 244/173
[58] Field of Search ............................. 136/246–247, 136/248, 292; 250/227; 350/96.1, 96.15, 96.21, 96.22, 96.23, 96.32; 244/173

[56] References Cited

U.S. PATENT DOCUMENTS 4,292,959  10/1981  Coburn, Jr. ..................... 126/438
4,433,199   2/1984  Middy ............................. 136/246

FOREIGN PATENT DOCUMENTS 3109284   9/1982  Fed. Rep. of Germany ...... 136/248
57-68083  4/1982  Japan ............................. 136/246
57-93583  6/1982  Japan ............................. 136/246
61-231773 10/1986 Japan ............................. 136/246
62-45080  2/1987  Japan ............................. 136/246

Primary Examiner—Aaron Weisstuch
Attorney, Agent, or Firm—Ashen Martin Seldon Lippman & Scillieri

[57] ABSTRACT

A survivable solar power-generating system for use with spacecraft is disclosed comprising optical means positioned to collect and concentrate solar energy flux, a flexible solar energy flux transmission line for conducting the concentrated solar flux towards a solar energy converter, and solar energy conversion means including an array photovoltaic cells for converting the solar energy flux to electrical power to be applied to on-board equipment of the spacecraft. A protected enclosure is positioned about the photovoltaic cells to shield them from destructive radiation and particulate matter. The transmission line includes a plurality of optical fiber waveguides whose input ends are positioned to receive the concentrated solar energy flux. Means are provided for moving the input ends of the optical fiber waveguides to optimize the quantity of concentrated solar flux entering the waveguides.

20 Claims, 10 Drawing Sheets

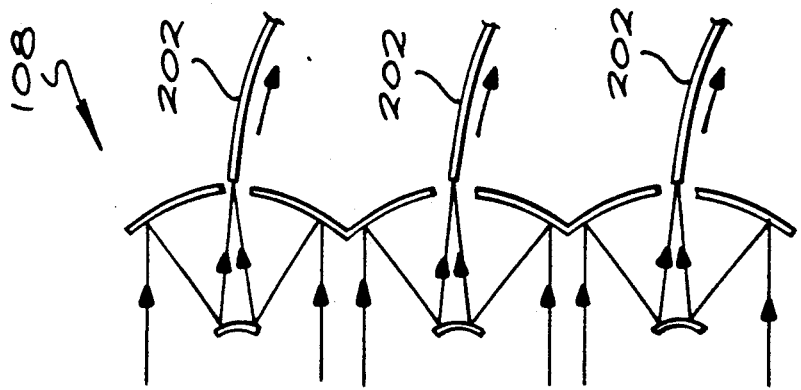
FIG. 3C  CASSEGRAINIAN ARRAY
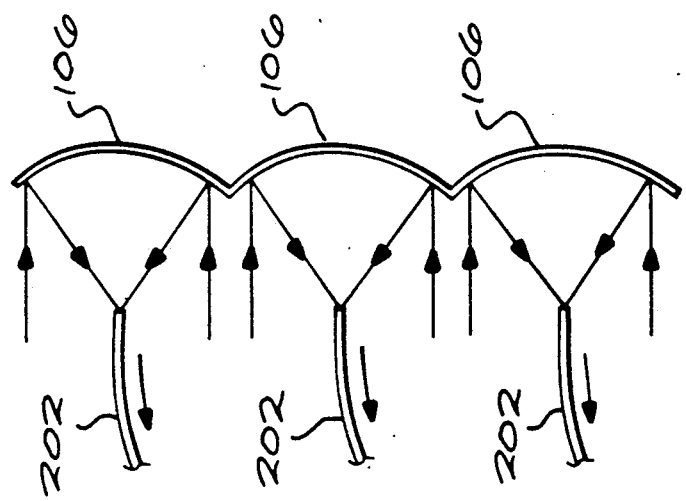
FIG. 3B  PARABOLIC MIRROR ARRAY
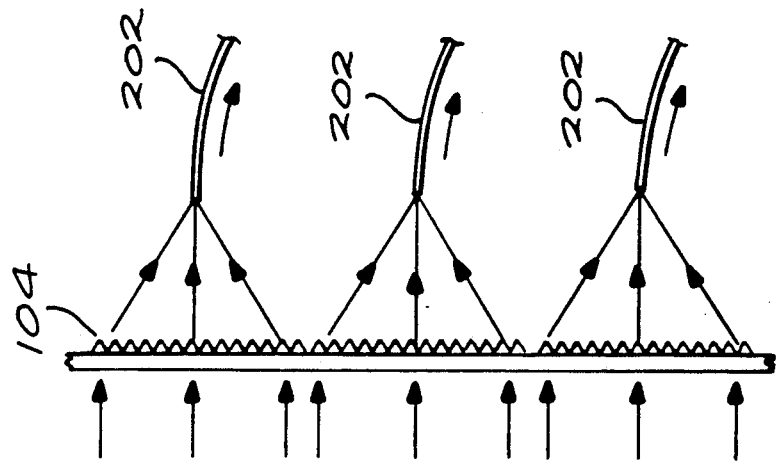
FIG. 3A  FRESNEL LENS ARRAY

SINGLE FIBER MATRIX

TAPERED FIBER MATRIX

FROM PRIMARY CONCENTRATOR

MULTI-FIBER BUNDLE

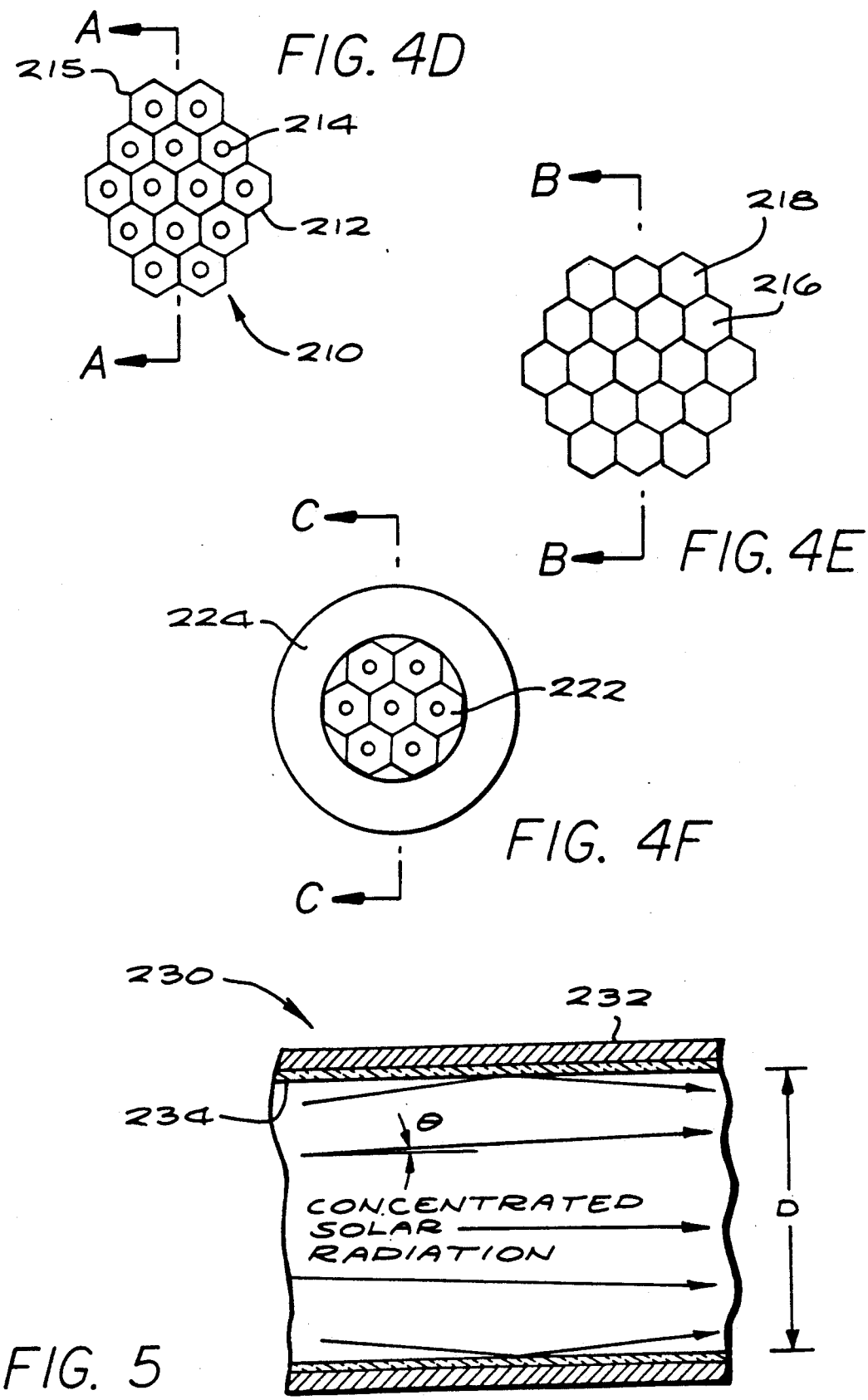

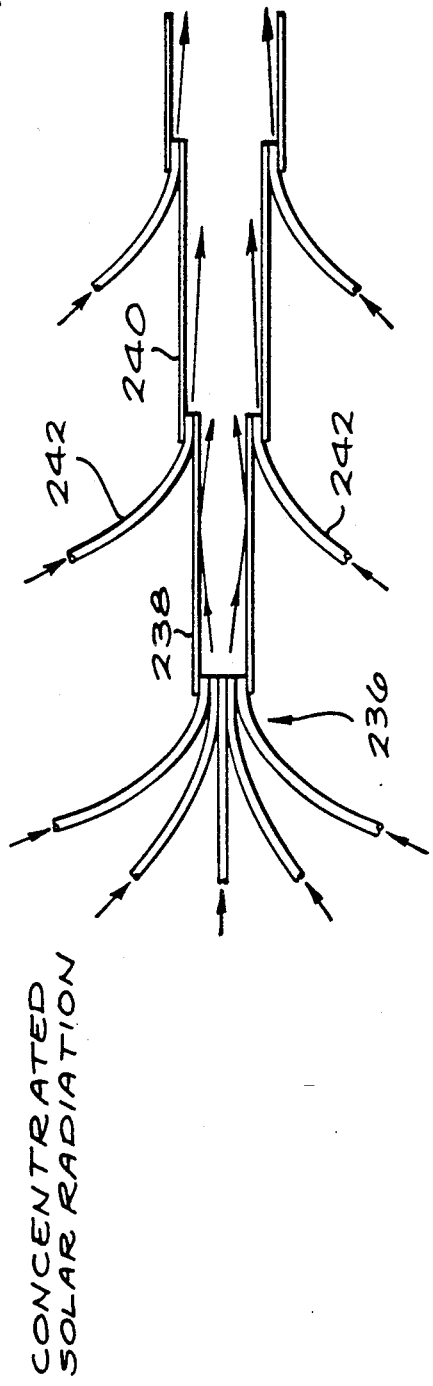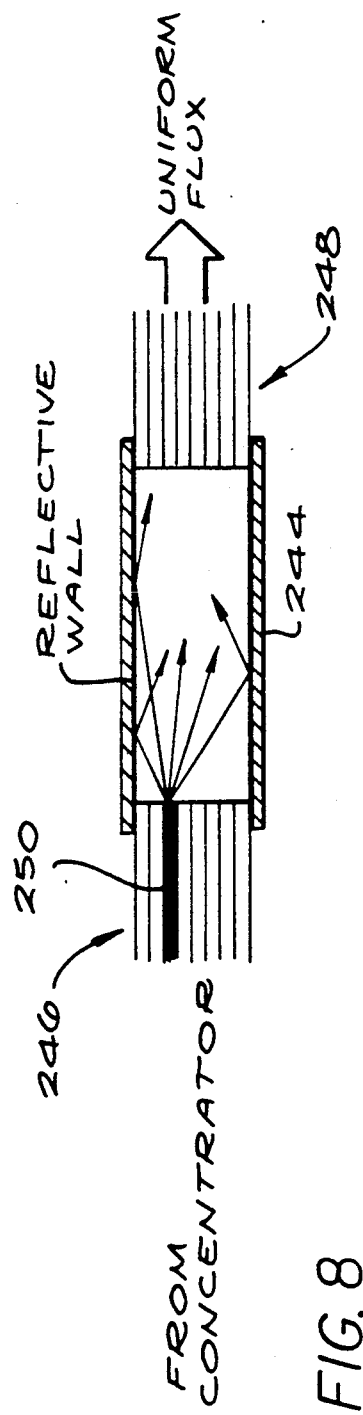

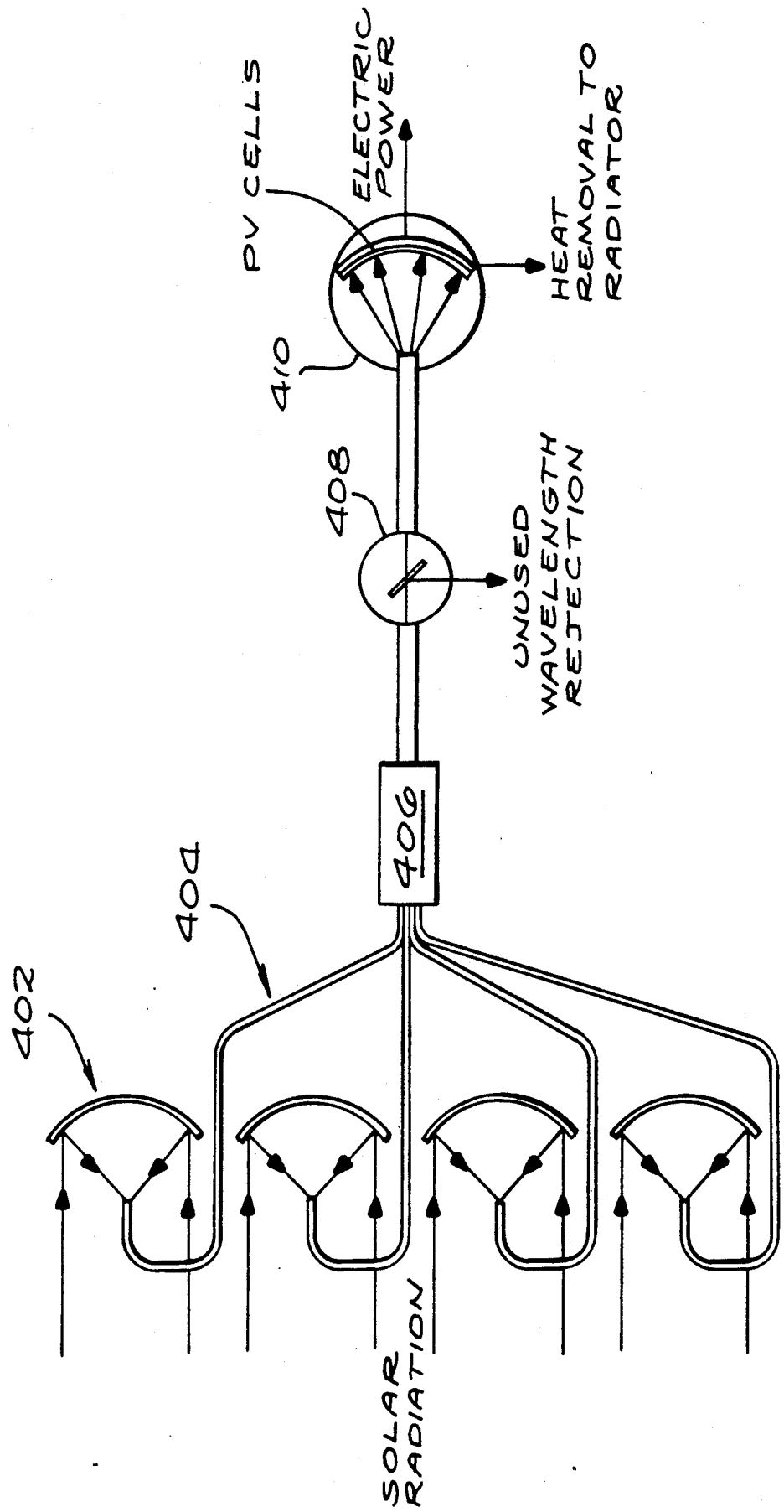

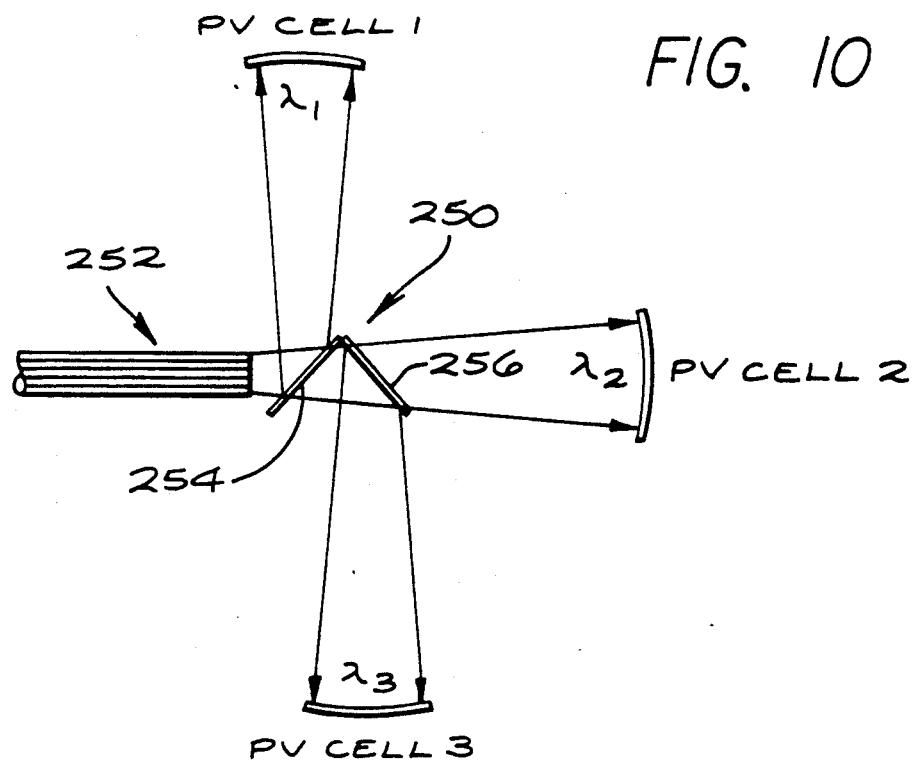
FIG. 10
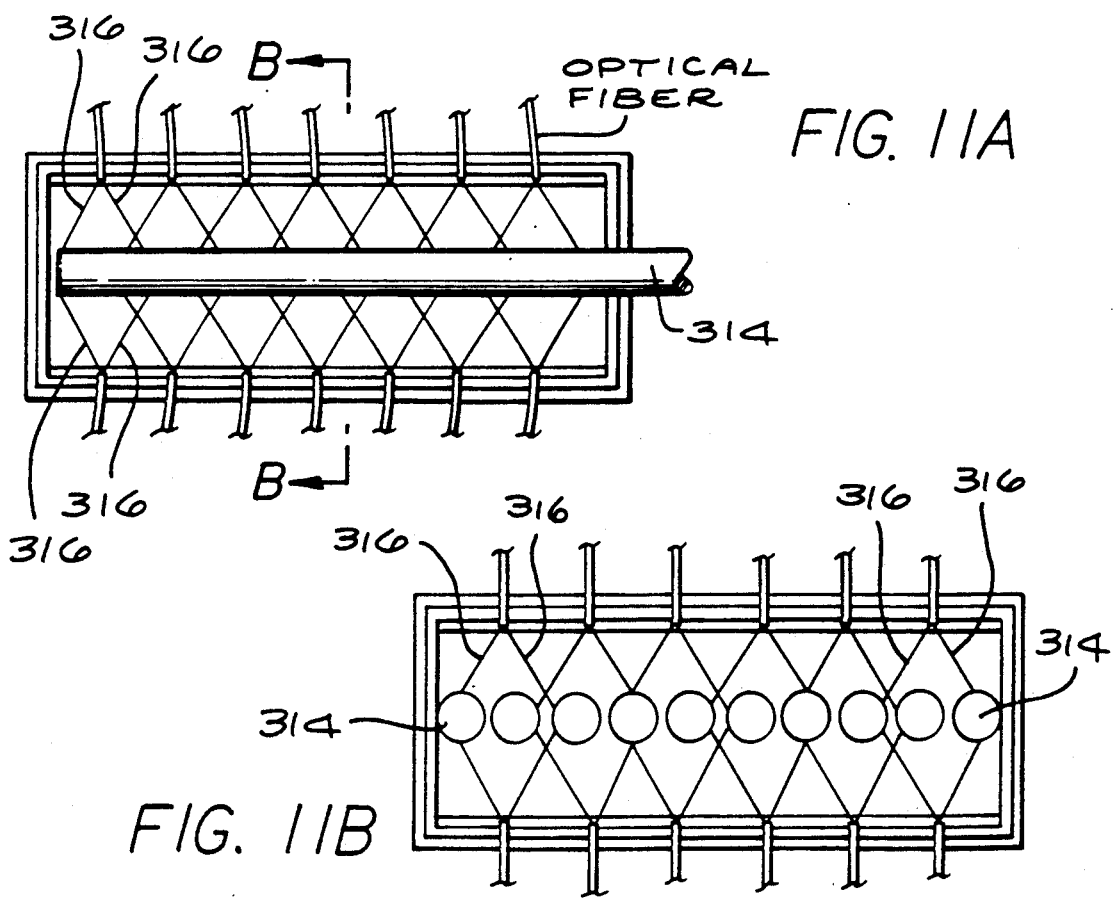
FIG. 11A
FIG. 11B

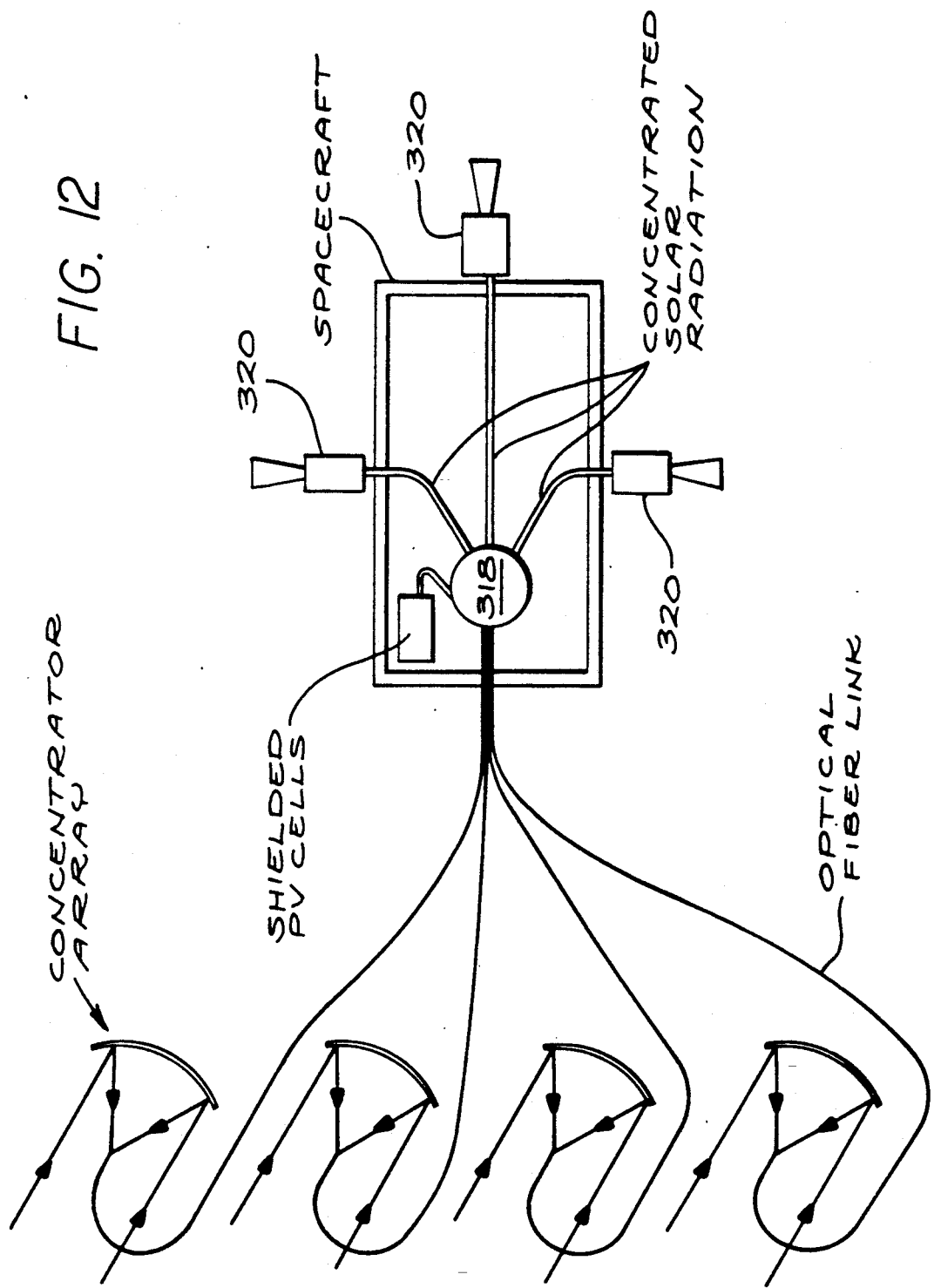

SURVIVABLE SOLAR POWER-GENERATING SYSTEMS FOR USE WITH SPACECRAFT

The invention relates to solar power-generating systems for use with spacecraft.

BACKGROUND OF THE INVENTION

During the past three decades, spacecraft power requirements have increased steadily from a few watts to multiple kilowatts as the complexity and sophistication of on-board equipment has grown. With this trend, the survivability and efficiency of the spacecraft's power generating system have become increasingly important.

As used herein, the term "spacecraft" includes both manned and unmanned spacecraft, as well as satellites. The power generating systems typically employed in spacecraft are nuclear or solar powered. Nuclear powered systems have been the subject of increasing criticism owing to the perceived danger of radioactive fallout triggered by an accident or by strategic attack. Although solar power-generating systems are not subject to this type of mishap, they are vulnerable to degradation and destruction by both man-made and naturally occurring radiation, space plasma, high energy particles, space debris and kinetic energy particles.

Solar power-generating systems have typically included massive arrays of photocells which produce electrical energy when impinged upon by solar radiation. However, these photocells have been susceptible to damage from numerous sources in the hostile environment of space. In terms of natural phenomena, photocells are degraded by the impact of high energy ionic, atomic and molecular particles, as well as by electrons and neutral subatomic particles. Such high energy particles are especially abundant in the Van Allen Belt surrounding the earth. The effect of these impacts is a continuing degradation of photocell efficiency which ultimately renders the cell inoperable.

Current efforts to make photocell arrays less vulnerable to the aforedescribed threats include the hardening of the array by encapsulating the photocells within a thick glass shield. While shields and the like can help protect the photocells from damage due to collision with particulate matter, the extra weight which must be lofted that is attributable to the shield adversely effects the economics of the lift-off.

For the same economic reasons, an important measure of system performance is the number of "kilowatts per kilogram". However, because the efficiency of solar power-generating systems typically diminishes within a few years after launch owing to the performance-degrading effects of incident radiation and impacting particles on the photocells, solar power systems must be compensatorily overdesigned by as much as 30% so that energy production degrades to a still-acceptable limit. The consequently increased size and/or number of photocell arrays and other system components adversely adds to the weight which must be lofted.

Another obstacle to the survivability of high power on-board systems is the presence of space plasma which can short circuit and destroy the photocells that operate at high voltages. Although the theoretical vacuum of space is a perfect insulator, space plasma which is abundant in low level earth orbit electrically short circuits photocells. The plasma is characterized by a breakdown voltage that can be exceeded by the operating voltages of photocells in the high power-generating systems now needed by spacecraft. When the breakdown voltage is exceeded, the plasma conducts an electrical current, short-circuiting the photocell and rendering it inoperative.

Turning to man-made photocell-degrading phenomenon, x-rays and gamma rays, such as those generated by nuclear explosions, as well as high power laser beams, directed energy beams and kinetic energy projectiles can all be used to degrade and/or destroy the photocell array. When any one photocell in an array is destroyed, a number of other cells in the array are often effectively rendered inoperable because the cells are electrically connected in series. Since each photocell produces a maximum of approximately 1 volt, the series arrangement is used to boost the generated voltage up to the 28-100 volts utilized by the on-board equipment. As a result, the power-generating system of the spacecraft can quickly become inadequate or inoperative when a limited number of the photocells are destroyed, effectively knocking out a greater number of cells.

SUMMARY OF THE INVENTION

Accordingly, the invention herein is an efficient, highly survivable solar power-generating system for use on board spacecraft. The power-generating system comprises optical means positioned to collect, concentrate, and conduct solar energy flux to a remote solar energy converter, and solar energy conversion means substantially enclosed by a protective shield against impingement of destructive radiation and particulate matter for converting solar energy into electrical energy.

The optical means includes optical waveguide means having an input end region for receiving concentrated solar energy flux, an output end region positioned to direct concentrated solar energy flux into the conversion means, and at least one flexible solar energy transmission line between the input and output ends.

Additional details concerning the invention will be apparent from the following Description of the Preferred Embodiment of which the drawing is a part.

BRIEF DESCRIPTION OF THE DRAWINGS

FIGS. 3A-C are schematic illustrations of alternative components for concentrating the level of solar flux carried by the optical waveguide transmission line of the system in FIG. 1;

FIG. 5 is a schematic illustration of a lightpipe, in section, usable in the optical waveguide transmission line of the system of FIG. 1;

FIG. 6 is a schematic illustration of a means for deploying optical fibers and lightpipes effectively to transmit solar radiation in the on-board solar power-generating system of FIG. 1;

FIG. 7 is a schematic illustration of an alternative survivable solar power-generating system for use on board spacecraft;

FIG. 8 schematically illustrates a sectional view of an optical scrambler for protecting the system of FIG. 1 from attack by laser radiation;

FIG. 10 is a schematic illustration of a multi-spectral beam splitter for use in the system of FIG. 9 to improve energy conversion efficiency;

FIG. 11A-B are respectively longitudinal and cross sectional views, in schematic, of a solar dynamic receiver cavity constructed in accordance with the invention for use in the system of FIGS. 1 or 9; and FIG. 12 is a schematic illustration of an optically switchable power-generating system constructed in accordance with the invention.

DESCRIPTION OF THE PREFERRED EMBODIMENT

Figure 1:
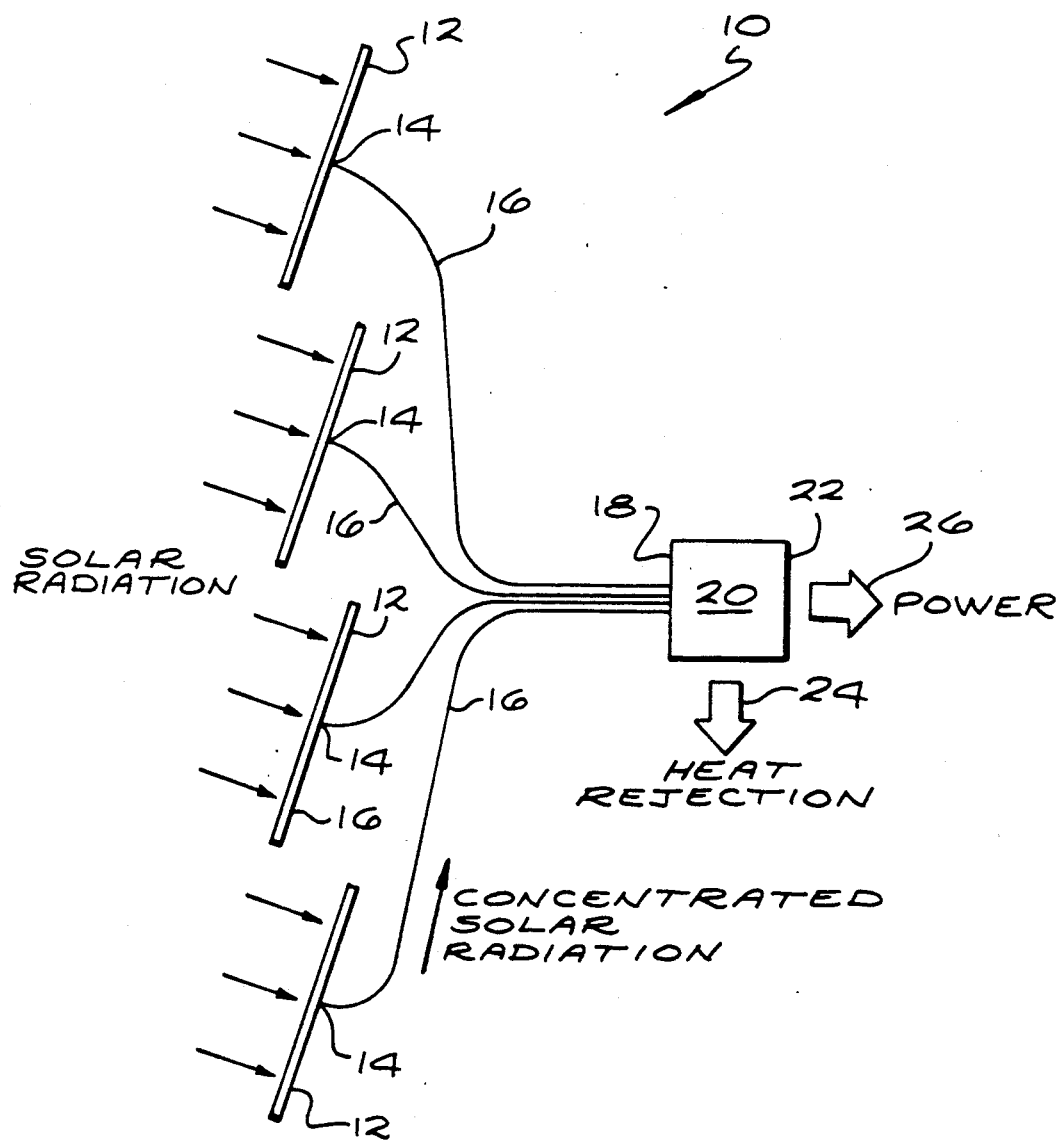
FIG. 1 is a schematic illustration of a survivable solar power-generating system for use on board spacecraft, and constructed in accordance with the invention.

FIG. 1 is a schematic representation of a survivable solar power generation system constructed in accordance with the invention. The system comprises an optical means 10 positioned to collect, concentrate, and transmit solar energy to a solar energy converter 20 which is substantially enclosed by a protective shield 22 against impingement of destructive radiation and particulate matter for converting solar energy into electrical energy.

The optical means 10 includes concentrator means 12 which gather and concentrates incident solar radiation, and couples the concentrated solar radiation into the input end 14 of optical waveguide means 16. The waveguide means is depicted as comprising a plurality of flexible optical fiber waveguides the output ends 18 of which direct the solar energy into he conversion means. Solar power is converted to electric power by the conversion means 20, and the waste heat is rejected from the power system.

The use of optical fiber waveguides to transmit solar radiation is discussed in "Application of Optical Fibers to the transmission of Solar Radiation" by Daisuke Kato and Takashi Nakamura, *Journal of Applied Physics*, Vol. 47, pp. 4528-4531, No. 10, October 1976, the contents of which are hereby incorporated by reference. As described in that article, optical fibers are capable of carrying high concentrations of solar energy with little loss for distances of about 40 meters.

Figure 2:
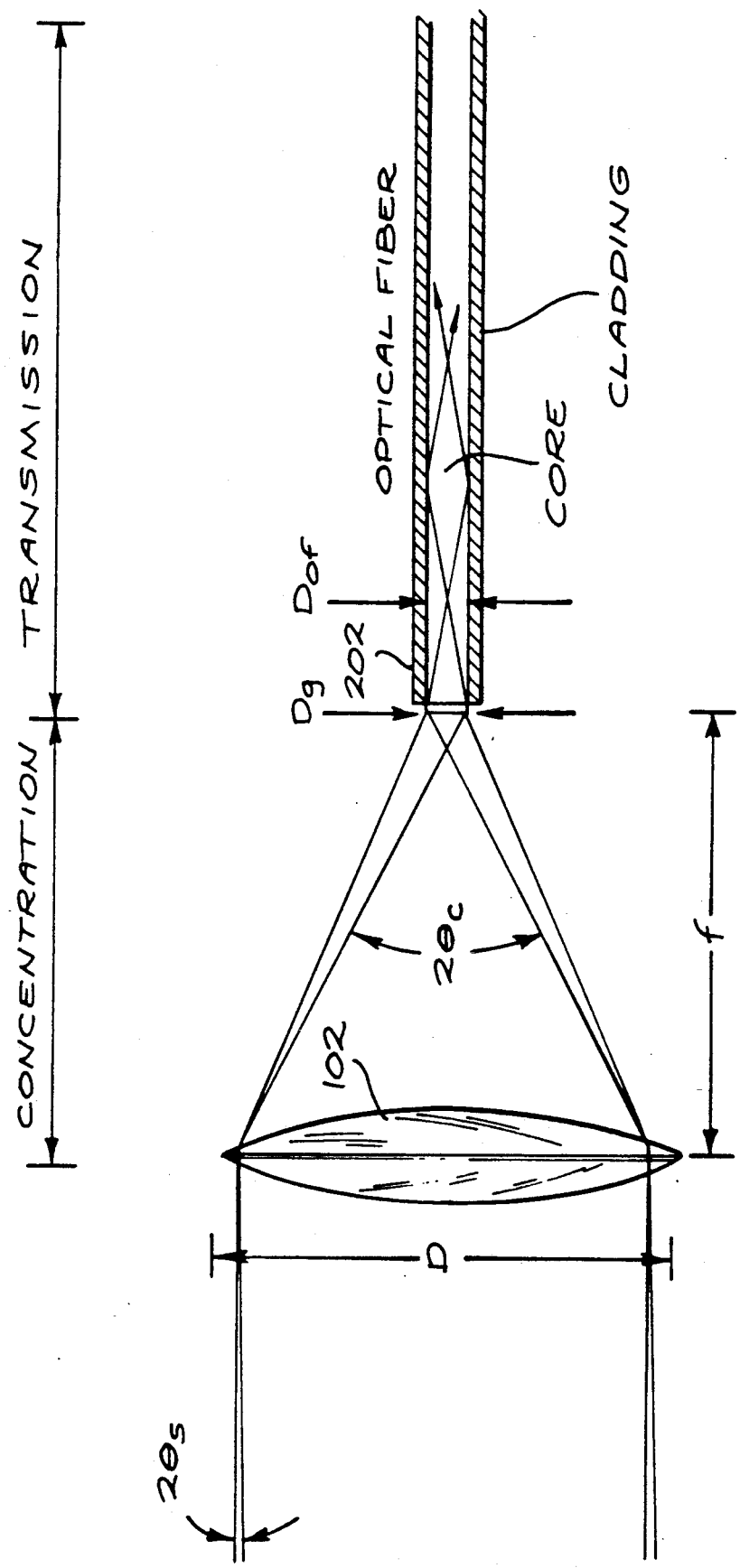
FIG. 2 is a schematic illustration of a lens system for concentrating the level of solar flux carried by the optical waveguide transmission line of the system in FIG. 1.

Turning initially to the concentrator means 10, reference is made to FIG. 2 which illustrates a lens system for concentrating the level of solar flux carried by the optical waveguide transmission line of the system in FIG. 1. In this embodiment, the concentrator means comprises a single lens 102 which concentrates incident solar energy into the receiving end of a single optical fiber waveguide 202. The concentrated solar energy remains inside the optical fiber due to its efficient internal reflection process as illustrated in FIG. 2. The concentration ratio in this process is determined by the ratio of the lens and optical fiber such that $$CR = (D/D_g)^2 \qquad \text{(Eq. 1)}$$

where:

D is the lens diameter $D_g$ is the solar image diameter (made equal to optical fiber dia.)

The achievable concentration ratio (i.e., the maximum diameter ration of D to $D_g$) is determined by a combination of factor, and is mathematically derived as follows:

$$CR = (D/D_g)^2 = 4.6 \times 10^4 (NA^2/1 - NA^2) \qquad \text{(Eq. 2)}$$

where:

D = collector diameter $D_g$ = solar image diameter, $2f\theta_s$ $D_{of}$ = optical fiber dia.

$2\theta_c$ = collector convergence angle $2\theta_s$ = angular diameter of sun, $\theta_s = 0.267°$ NA = numerical aperture, $\sin\theta_c$ Examples of other preferable arrangements are illustrated in FIGS. 3A-C which respectively illustrate the use of Fresnel lenses 104, parabolic mirrors 106 and Cassegrainian arrays 108 to accomplish the task.

Figure 4A:
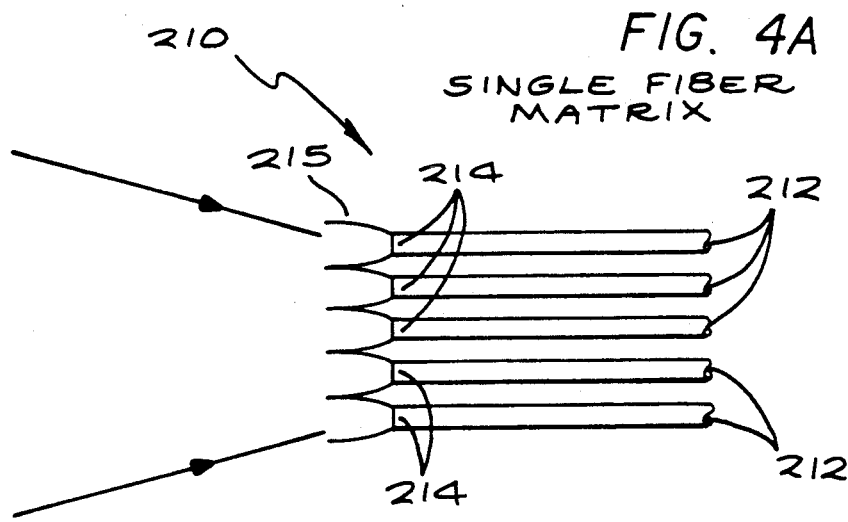
FIGS. 4A-C are schematic sectional illustrations of alternative arrangements for providing secondary concentration of the level of solar flux carried by the optical waveguide transmission line of the system in FIG. 1, and have been taken along lines A—A, B—B and C—C of FIGS. 4D-F, respectively.
Figure 4B:
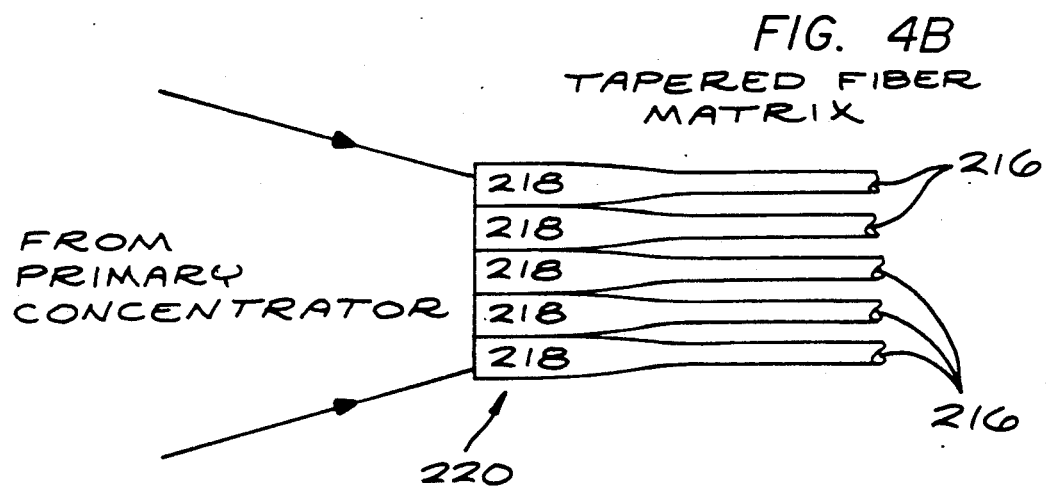
Figure 4C:
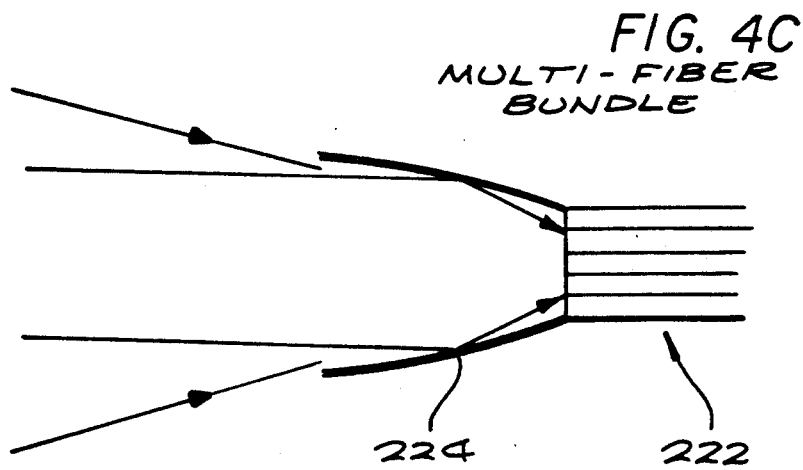

Since the concentrated beam of solar energy from a concentrator is likely to be greater in diameter than the internal diameter of a single optical waveguide fiber, system efficiency is maximized by focusing the concentrated solar energy into a plurality of contiguous fibers, and by also providing secondary concentrator means at the input end of the fibers for maximum efficiency. FIGS. 4A-C are schematic illustrations in section of multiple fiber transmission line configurations having secondary concentrator structures intended to capture a maximum quantity of concentrated solar energy. The sections in FIGS. 4A-C are respectively along lines A—A, B—B and C—C in FIGS. 4D-F.

In FIG. 4A, the secondary concentration means includes a plurality of generally tubular, truncated conical bodies 215 having smaller and larger end portions. The smaller end portion of each body is attached to the input end 214 of a respective fiber 212 of a fiber bundle 210. The horn-shaped secondary concentrators function as optical funnels, capturing concentrated energy propagated along paths which are not focused onto the fiber ends.

In FIG. 4B, secondary concentration is provided by enlarged ends of each fiber 216 which capture concentrated energy flux that would not normally be incident on the unenlarged input end of the fiber. The configuration is illustrated as comprising a plurality of optical waveguide fibers 216 having enlarged, input ends 218 of generally hexagonal cross section. The enlarged input ends are formed by applying a radially directed squeezing force to the end region 220 of a fiber bundle generally evenly about the circumference of the bundle and under controlled heat and pressure. The initially cylindrical end regions 220 of neighboring fibers in the bundle mutually deform each other into generally hexagonal shapes which fill the empty regions between the fiber ends. The enlarged input end of each fiber is generally contiguous with the enlarged ends of neighboring fibers in the bundle, thereby optimizing solar flux capture.

FIG. 4C illustrates a multi-fiber bundle 222 wherein the secondary concentration means is a single, generally conically shaped optical funnel 224 is fused, or otherwise affixed, to the end of the bundle to capture the concentrated solar energy within the plurality of individual fibers forming the bundle. In this configuration, the input end portions of the optical fiber waveguides are generally unidirectionally bunched within the bounds of the consequently defined bundle of waveguide input ends. The funnel is a generally tubular, truncated conical body having smaller and larger end portions. The smaller end circumvents the input end of the bundle, while the larger end is positioned to gather the concentrated solar energy flux from the optical means. The funnel thereby captures concentrated solar energy flux propagating along paths which are not focused onto the input ends of the fibers in the bundle.

The matrix of horn-shaped secondary concentrators in FIG. 4A, the tapered fiber ends in FIG. 4B, and the conically shaped optical funnels in FIG. 4C act as couplers which accommodate the concentrated solar rays into individual fibers. At the same time, they act as secondary concentrators which provide further concentrations of the solar rays coming from the primary concentrator. A detailed mathematical analysis has shown that the use of a secondary concentrator relaxes the otherwise stringent requirements for the primary concentrator, while permitting concentration ratios of as much as 10,000 or more.

Regardless of the specific primary or secondary concentrator means utilized, efficiency of the power-generating system can be assured by including means for adjusting the relative positions of the primary and secondary concentrators to compensate for the changing position of the sun. As the position of the sun shifts due to spacecraft movement, a compensatory tracking movement by either or both of the concentrators insures that the concentrated solar energy is always axially aligned with the fibers comprising the bundle for maximum conduction of the solar flux.

Because of the relatively low mass of the input fiber ends, the ends can be repositioned precisely, and with little energy consumption, to track the moving focal point of the optical means. Thus, the focal spot or spots of the optical means will be maintained on the input end of the fiber transmission line as the position of the sun shifts with spacecraft movement.

As is known to those skilled in the art, optical waveguide fibers comprise a core of fused silica or other light-transmitting material surrounded by a cladding of material having a smaller index of refraction than the core. Light propagating along the fiber is confined within the core of an optical waveguide fiber by a total reflection process at the core/cladding boundary. Since the reflection process is theoretically 100% efficient, fibers are ideal media to direct light along non-straight paths. Bundles of fibers capable of transmitting large quantities of solar energy over relatively long distances may, however, be characterized by a prohibitively large weight. The weight of the transmission line may accordingly be reduced by means of a hollow light pipe as illustrated in FIG. 5.

FIG. 5 is a schematic sectional view of a hollow light pipe. The light pipe 230 is a hollow, generally cylindrical structure having an outer structural wall 232 and an inner multi-layer dielectric reflective film 234 formed on the interior surface of the structural wall. The reflectivity of the film is typically 99.9%, and transmission efficiencies of 90% for the lightpipe are obtainable if the ratio of the pipe's length-to-inside diameter is 1000. Thus, a pipe having a 10 cm I.D. and a length of up to 100 meters will perform satisfactorily. Since the reflection process is less than 100% efficient, the light pipe should be used for transmission of light along straight paths to avoid excessive reflection loss. Since propagation of the light is through the void defined within the structural wall of the pipe, the weight of the pipe is small even when used for transmitting large quantities of solar radiation over long distances.

FIG. 6 illustrates a manner for deploying optical fibers and lightpipes effectively to transmit solar radiation in an on-board power-generating system. In the illustration, incremental additions of concentrated solar radiation to the lightpipe are accomplished by a telescopic configuration. An initial number of flexible optical waveguide bundles 236 are coupled at their respective output ends into a first light pipe 238. The output end of the first light pipe is, in turn, coupled into the receiving end of a larger diameter lightpipe 240, along with a number of additional fiber bundles 242. This process is repeated as required, so that concentrated solar radiation is injected into the lightpipe assembly as needed without any loss-inducing mechanism.

With the separation of the collection and conversion processes by the waveguide transmission line, a number of optical components may be used in the transmission path to increase the efficiency of the power-generating system. For example, selective beam splitters can be used to maximize photocell efficiency by dividing the concentrated optical beam into plurality of beams having selected wavelengths. Each of the beams of the selected wavelength can then be conducted to photocells which operated most efficiently at those wavelengths of incident light. In addition, beam splitters can be used to divert harmful irradiation from hostile laser weapons, since the wavelengths of such beams is predictable. In addition, power generation using highly concentrated solar radiation flux transmitted by flexible optical fibers permits the energy converting portion of the system to be placed at a location best suited for conversion and protection.

FIG. 7, for example, schematically illustrates an optical waveguide photovoltaic power generation system including an array of concentrators 402 which each concentrate solar radiation into an optical fiber link 404. The concentrated solar radiation passes through a PV protection device 406, and is split into one or more beams of selected wavelength by a selective beam splitter 408. The beams are optically transmitted to photovoltaic cells within a protective enclosure 410, where the concentrated solar radiation is first defocused to provide optimum radiation intensities for the PV cells. The temperature of the PV cells within the enclosure is regulated by a heat removal means; the beam splitter 408 may be used to reject solar radiation spectra outside of the PV cell conversion regime, thereby further reducing the heating of the cells. The PV cells are, of course, shielded by the protection device 406 from any highly focused laser radiation that could impinge upon the concentrators 402.

With the concentration and transmission systems described so far, the energy conversion process may be located in a place away from the collection region, and shielded from high energy particles and destructive radiation. To prevent harmful radiation from being transmitted along the waveguide transmission lines, one or more optical protection devices can be included within the transmission path in addition to, or instead of, the beam splitter mentioned above.

One example of a protective device is illustrated in FIG. 8 which schematically illustrates a sectional view of an optical scrambler. The scrambler is a hollow lightpipe 244 which connects two fiber bundles 246, 248.

The incoming fiber bundle 246 is illustrated as containing concentrated laser beam irradiation 250 from an on-axis attack. Interestingly, the concentrator which focuses the solar flux into the input end of the optical waveguide fibers causes a collimated laser beam to diverge after it is reflected into the fiber. As the diverging laser beam propagates through the light pipe, its strength is diluted by its random reflections against the lightpipe wall. By the time it reaches the photocell, the damaging effects of the beam are substantially neutralized. To further dissipate the energy of the laser irradiation, the light pipe can be filled with an absorption medium which dissipates energy at the anticipated wavelengths of laser weaponry.

Figure 9:
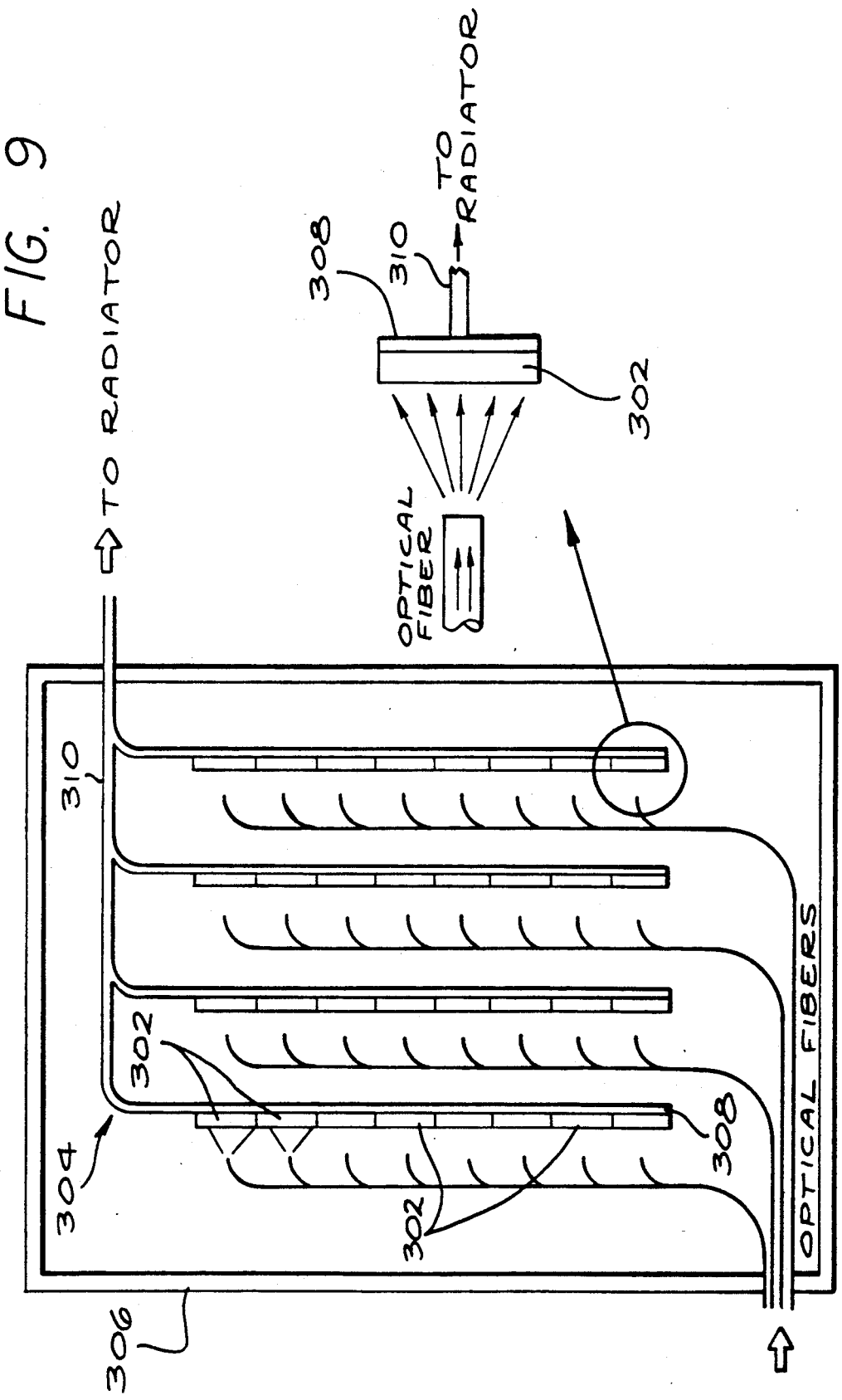
FIG. 9 is a schematic illustration, in section, of a shielded energy conversion unit for use in the system of FIG. 1 and constructed in accordance with the invention.

FIG. 9 schematically illustrates a photocell converter for converting solar radiation into electricity. A plurality of photocells 302 are mounted on a heat sink 304 within a protective shielded enclosure 306. The concentrated solar energy is defocussed at the output end of the transmission line to provide optimum radiation intensities for the photocells. The heat sink 304 is formed by a cooling plate 308 attached to the cell to keep the cell temperature within an optimum range. Waste heat is conducted from the plate by heat pipes 310 and removed from the cell array for rejection from the spacecraft radiator.

As schematically illustrated in FIG. 10, a selective beam splitter 250 may be used to direct radiation spectra selectively to a particular photocell or group of cells. Solar radiation from a fiber bundle 252 is directed against a selectively reflecting mirror 254 of the beam splitter. A narrow band of the incident radiation having a nominal wavelength of $\lambda_1$ is directed to a photocell means having its maximum conversion efficiency at $\lambda_1$. The non-reflected radiation is then split by a second selectively reflecting mirror 256 into a second reflected narrow-band of radiation of nominal wavelength $\lambda_2$, and a third transmitted narrow band of radiation of nominal wavelength $\lambda_3$. Photocell means with appropriate response characteristics receive the narrow band radiation thus produced for overall high conversion efficiency.

An additional advantage in separating the collection and concentration functions form the conversion process is the ability to directly power thermal processes without an intermediate conversion of the solar radiation to electricity. Since each energy-conversion process is accompanied by a loss, the direct supply of thermal energy to Brayton cycle, Sterling cycle or Rankin cycle systems results in a highly efficient use of the concentrated solar energy. For these processes, flexible optical fiber waveguides carrying concentrated solar energy are arranged around a receiver to achieve high temperature.

FIGS. 11A and 11B are schematic illustrations in longitudinal section and cross section, respectively, showing the application of the waveguide transmission system described herein to power a solar dynamic receiver. The receiver, like a number of thermal units, includes a plurality of heat pipes 314 which hold a phase-change material such as alkaline eutectic salt characterized by a large heat capacity. The output ends of a number of optical waveguide fibers 316 are arranged along the length of each heat pipes to heat the phase-change material attached to the wall of the pipe. As known in the art, the phase change material undergoes a phase change, typically at 1500° F., storing solar flux energy in the form of heat. The phase change material keeps the heat pipe at an essentially constant temperature. The heat pipe transmits the thermal energy to the heat engine cycle, such as Rankine, Brayton or Sterling cycles, to generate electricity.

Thermal thrusters for spacecraft propulsion can be directly powered by the optical waveguide system disclosed herein. For this purpose, hydrogen would typically be heated by concentrated solar energy carried to the thruster via optical waveguide fibers, and the heated hydrogen ejected to create the thrust. Owing to the flexibility of the optical fiber link, the size and shape of the thruster may be configured to optimize thrust and the specific impulse of the thruster. In addition, as illustrated in FIG. 12, the concentrated solar radiation flux can be selectively directed to by switch means 318 to any of a plurality of smaller thrusters 320 for dynamic control of the spacecraft.

Similarly, the separation of the collection and conversion processes permits a switching of optical energy to efficiently drive different equipment as the need arises. Using currently available optical switches such as precisely positionable mirrors, optical energy can be directed in varying amounts via the switches to photocells, thermal engines, high temperature ovens and the like as the demands for power by the various types of on-board equipment varies.

It will now be apparent that the separation of the collection and conversion functions permit the sensitive and critical conversion components to be effectively shielded from hostile and man-made threats. The higher concentration of solar flux carried by the optical fiber waveguides increases the efficiency of the generating system over that associated with prior art systems. Since the collectors and optical fibers do not carry electricity, and the electrical portion of the generating system can be confined to an environmentally controlled region, short circuiting by plasma at high operating voltages is prevented. In addition, off-axis laser attack does not focus on the photocells, and the on-axis beam can be blocked, filtered or scrambled.

While the foregoing description includes detail which will enable those skilled in the art to practice the invention, it should be recognized that the description is illustrative in nature and that many modifications and variations will be apparent to those skilled in the art having the benefit of these teachings. It is accordingly intended that the invention herein be defined solely by the claims appended hereto and that the claims be interpreted as broadly as permitted in light of the prior art.

I claim:

1. A solar power-generating system for use on board spacecraft comprising:
   optical means positioned to collect and concentrate solar energy flux;
   a flexible solar energy flux transmission line for conducting the concentrated solar energy flux towards a solar energy converter,
   solar energy conversion means including an array of photovoltaic cells for converting the solar energy flux to electrical power to be applied to on-board equipment of the spacecraft;
   a protective enclosure positioned about the photovoltaic cells for substantially shielding the photovoltaic cells from destructive radiation and particulate matter,
   wherein the transmission line includes a plurality of optical fiber waveguides having respective input and output end portions, the input end portions being respectively positioned to receive concentrated solar energy flux, the output end portions being respectively positioned to direct concentrated solar energy flux towards the conversion means; and means for moving the input ends of the optical fiber waveguides with respect to the optical means to generally optimize the quantity of concentrated solar flux entering the waveguides.

2. The system of claim 1 including means at the input end portions of the optical fiber waveguides for secondarily concentrating the concentrated solar energy flux.

3. The system of claim 2 wherein the input end portions of the optical fiber waveguides are generally unidirectionally bunched within the bounds of a consequently defined bundle of waveguide input ends, and wherein the secondary concentration means includes a generally tubular, truncated conical body having smaller and larger end portions, the smaller end portion effectively circumventing the input end portions of the waveguides in the bundle, the larger end portion being positioned to gather the concentrated solar energy flux, whereby the conical body acts like an optical funnel by capturing concentrated solar energy flux propagating along paths which are not focused onto the fiber input ends portions of the bundle.

4. The system of claim 2 wherein the secondary concentration means includes a plurality of generally tubular, truncated conical bodies having smaller and larger end portions, the smaller end portion of each body being positioned with respect to a respective fiber input end portion, with the larger end portion being positioned to gather concentrated solar flux, so that each conical body acts like an optical funnel by capturing concentrated solar energy flux propagating along paths which are not focused onto the respective fiber input end.

5. The system of claim 1 wherein the input ends of the optical fiber waveguides are respectively enlarged to gather and thereby secondarily concentrate the concentrated solar flux into the fiber waveguide.

6. The system of claim 5 wherein the plurality of fiber waveguides are arranged in bundles, with their respective enlarged input ends being contiguous with the enlarged ends of neighboring fiber waveguides in the bundle.

7. The system of claim 1 wherein the optical means is characterised by a plurality of focal points at which it concentrates a respective plurality of solar energy flux beams, and including tracking means responsive to movement of at least one focal point with respect to at least one fiber input end for repositioning the fiber bundle to maintain generally optimal flux transmission.

8. The system of claim 1 including a lightpipe positioned to receive and conduct the concentrated solar flux passing through the flexible transmission line.

9. The system of claim 8 including first and second lightpipes having respective input and output regions, an initial number of flexible optical fiber waveguides having respective input ends and output ends, the fiber waveguides being coupled at their respective output ends into the input region of a first light pipe, the output region of the first lightpipe being coupled into the input region of the second lightpipe, a number of additional fiber waveguides being coupled into the input region of the second lightpipe whereby concentrated solar radiation is injected into the second lightpipes as needed without substantial energy loss.

10. The system of claim 8 wherein the light pipe comprises a hollow structural body having a highly reflective inner wall, and the body of the lightpipe is substantially filled with a fluid which attenuates radiation flux of a preselected wavelength.

11. The system of claim 1 including beam splitting means positioned to receive the concentrated solar flux passing through the flexible transmission line and to divide the flux into a plurality of limited bandwidth spectral components, a plurality of photovoltaic cell groups, the groups being most efficiently operable in response to incident spectral energy at different nominal wavelengths, and optical waveguide means for directing each spectral component to the group of the photovoltaic cells operating most efficiently at the nominal wavelength of the spectral component.

12. The system of claim 11 wherein the beam splitting means includes means for diverting radiation flux of predetermined wavelength away from the photovoltaic cells.

13. The system of claim 1 including beam splitting means positioned to receive the concentrated solar flux passing through the flexible transmission line and to divide the flux into a plurality of limited bandwidth spectral components, a photovoltaic cell group operable in response to incident spectral energy, and the beam splitting means includes means for diverting radiation flux of predetermined wavelength away from the photovoltaic cell group.

14. The system of claim 1 wherein the energy conversion means further includes a plurality of devices for converting solar energy flux into other forms of energy, and wherein the system includes optical switch means for selectively distributing the gathered solar energy flux to various ones of the devices in accordance with the needs of the on-board equipment.

15. The system of claim 1 including solar dynamic receiver means having a number of heat pipes for conducting thermal energy, a plurality of optical fiber waveguides having respective output ends, the output ends being disposed along at least a portion of the length of each heat pipe to direct material-heating solar flux against the exterior of the heat pipe.

16. The system of claim 15 including a thermal energy-responsive phase-change material on the wall of the heat pipes for alternatively storing and releasing thermal energy.

17. The system of claim 15 including a quantity of circulating working fluid which thermally contacts the heat pipes to absorb and conduct thermal energy therefrom.

18. The system of claim 1 including solar dynamic receiver means having a number of heat-conducting elements, and a plurality of optical fiber waveguides having respective output ends, the output ends being disposed along at least a portion of the length of each heat-conducting element to direct material-heating solar flux against the exterior of the elements.

19. The system of claim 18 including a thermal energy-responsive phase-change material on the walls of the heat-conducting elements for alternatively storing and releasing thermal energy.

20. The system of claim 18 including a quantity of circulating working fluid which thermally contacts the heat-conducting elements to absorb and conduct thermal energy therefrom.

* * * * *